United States Patent
Bell et al.

(10) Patent No.: US 7,285,499 B1
(45) Date of Patent: Oct. 23, 2007

(54) POLYMER SPACERS FOR CREATING SUB-LITHOGRAPHIC SPACES

(75) Inventors: Scott A. Bell, San Jose, CA (US); Phillip Lawrence Jones, Fremont, CA (US); Angela T. Hui, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 16 days.

(21) Appl. No.: 11/127,175

(22) Filed: May 12, 2005

(51) Int. Cl.
*H01L 21/302* (2006.01)
*H01L 21/461* (2006.01)

(52) U.S. Cl. .............. 438/706; 438/595; 438/689; 438/725; 438/780; 204/192.1

(58) Field of Classification Search .......... 438/706, 438/595, 689, 725, 780; 204/192.1
See application file for complete search history.

(56) References Cited

U.S. PATENT DOCUMENTS

| | | | |
|---|---|---|---|
| 6,620,741 B1 * | 9/2003 | Gracias et al. | 438/780 |
| 6,797,565 B1 | 9/2004 | Yang et al. | |
| 6,927,145 B1 | 8/2005 | Yang et al. | |
| 2004/0058518 A1 * | 3/2004 | Fang et al. | 438/595 |
| 2005/0136630 A1 * | 6/2005 | Kim | 438/586 |
| 2005/0212035 A1 | 9/2005 | Utsuno et al. | |
| 2006/0030151 A1 * | 2/2006 | Ding et al. | 438/687 |
| 2006/0154477 A1 * | 7/2006 | Geng et al. | 438/637 |

FOREIGN PATENT DOCUMENTS

| | | |
|---|---|---|
| DE | 101 10 150 A1 | 9/2002 |
| EP | 1 170 800 A2 | 1/2002 |

OTHER PUBLICATIONS

Choukourov et al. (Surface and Coating Technology 151-152 (2002) pp. 214-217).*
2002 IEEE International Solid-State Circuits Conference, Session 6, "SRAM and Non-Volatile Memories," Feb. 4, 2004, 6 pages.
2002 IEEE International Solid-State Circuits Conference, 23 pages.

* cited by examiner

*Primary Examiner*—Lan Vinh
*Assistant Examiner*—Mahmoud Dahimene
(74) *Attorney, Agent, or Firm*—Harrity Snyder, LLP

(57) ABSTRACT

A method includes forming a group of first structures on a semiconductor device and forming spacers adjacent side surfaces of each of the first structures to form a group of second structures. The method further includes using the group of second structures to form at least one sub-lithographic opening in a material layer located below the group of second structures.

17 Claims, 17 Drawing Sheets

POLYMER SPACERS FOR CREATING SUB-LITHOGRAPHIC SPACES

FIELD OF THE INVENTION

Implementations consistent with the principles of the invention relate generally to semiconductor manufacturing and, more particularly, to forming sub-lithographic spaces in semiconductor devices.

BACKGROUND OF THE INVENTION

The escalating demands for high density and performance associated with non-volatile memory devices require small design features, high reliability and increased manufacturing throughput. The reduction of design features, however, challenges the limitations of conventional methodology.

For example, currently, lithography is limited in its ability to print spaces (or contacts) less than 100 nanometers (nm) in width or diameter. There exists a need to print spaces (or contacts) that are beyond lithographic capabilities.

SUMMARY OF THE INVENTION

In an implementation consistent with the principles of the invention, a method includes forming a first material layer on a semiconductor device; forming a photoresist layer; patterning the photoresist layer to form at least two masks; forming polymer spacers on adjacent side surfaces of the at least two masks; and etching the first material layer using the at least two masks and the polymer spacers to create at least one sub-lithographic space in the first material layer.

In another implementation consistent with the principles of the invention, a method includes forming a group of first structures on a semiconductor device and forming spacers adjacent side surfaces of each of the first structures to form a group of second structures. The method further includes using the group of second structures to form at least one sub-lithographic opening in a material layer located below the group of second structures.

In yet another implementation consistent with the principles of the invention, a method for forming an opening in a semiconductor device is provided. The method includes forming a group of first structures on a semiconductor device; forming spacers adjacent side surfaces of each of the group of first structures to form a group of second structures; and using the group of second structures as a mask to form an opening in a material layer located below the group of second structures. The opening is formed to a width less than approximately 100 nm.

BRIEF DESCRIPTION OF THE DRAWINGS

The accompanying drawings, which are incorporated in and constitute a part of this specification, illustrate an embodiment of the invention and, together with the description, explain the invention. In the drawings.

DETAILED DESCRIPTION

The following detailed description of implementations consistent with the principles of the invention refers to the accompanying drawings. The same reference numbers in different drawings may identify the same or similar elements. Also, the following detailed description does not limit the invention. Instead, the scope of the invention is defined by the appended claims and their equivalents.

Exemplary Processing

Figure 1:
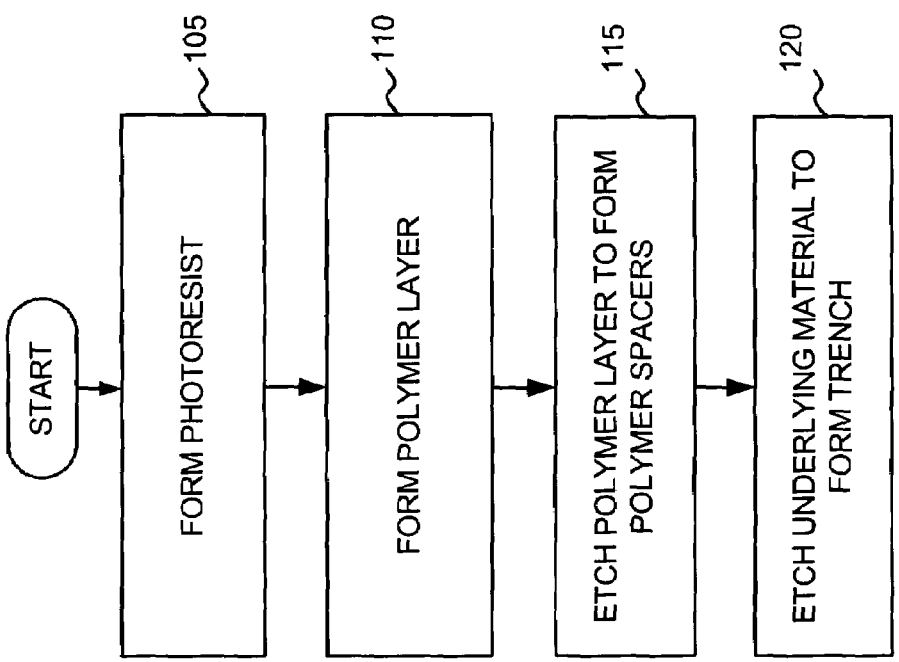
FIG. 1 illustrates an exemplary process for forming a semiconductor memory device in an implementation consistent with the principles of the invention.

FIG. 1 illustrates an exemplary process for forming sub-lithographic spaces for a semiconductor device in an implementation consistent with the principles of the invention. In one implementation, the semiconductor device may include a flash memory device. FIGS. 2-5 illustrate exemplary views of a semiconductor device fabricated according to the processing described in FIG. 1.

Figure 2:
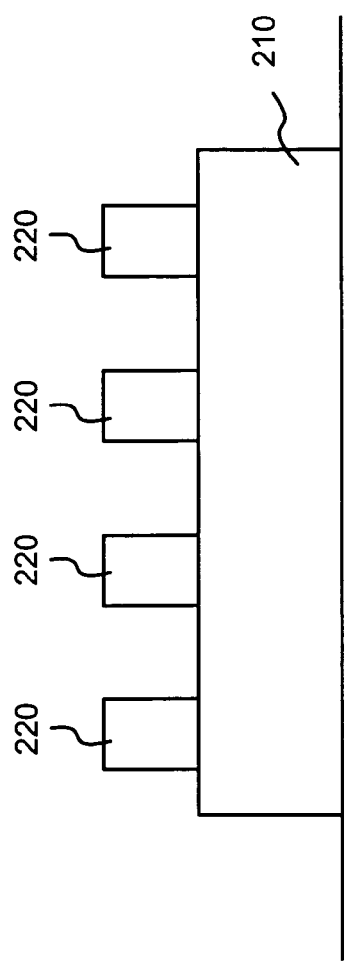
FIGS. 2-5 illustrate exemplary views of a semiconductor device fabricated according to the processing described in FIG. 1.

With reference to FIGS. 1 and 2, processing may begin with a semiconductor device 200 that includes a layer 210 (or an area 210). In one implementation, layer 210 may comprise any material in which one or more sub-lithographic spaces are to be formed. For example, layer 210 may comprise a hard mask material, such as amorphous carbon, a low-k dielectric (e.g., SiLK), $SiO_2$, or SiOC. Alternatively, layer 210 may comprise a dielectric anti-reflective coating (ARC), a polysilicon material, or other materials. Layer 210 may have a thickness ranging from about 100 Å to about 2,000 Å.

A photoresist material may be patterned and etched to form masks 220 on the top surface of layer 210 (act 105). Masks 220 may be used to facilitate etching layer 210, as described in more detail below. The width of each mask 220 may range from about 800 Å to about 2,000 Å. In addition, the pitch (i.e., the center-to-center distance between masks 220) may range from about 1,200 Å to about 2,000 Å.

Figure 3:
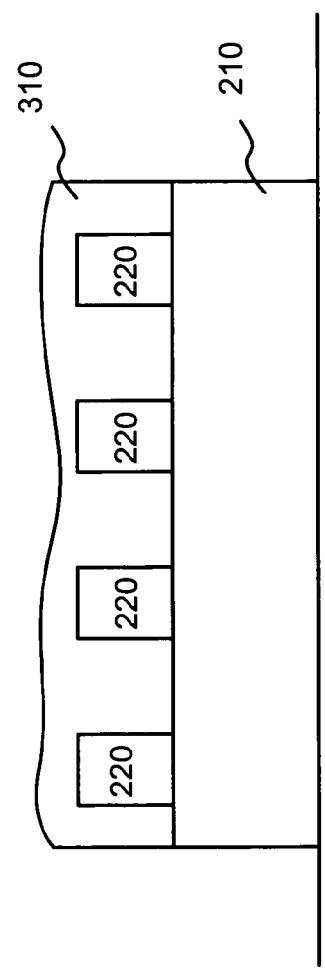

An in-situ polymer spacer deposition and etch may be performed (acts 110 and 115). For example, a polymer material 310 may be deposited on semiconductor device 200, as illustrated in FIG. 3 (act 110). Polymer material 310 may be deposited to a thickness ranging from about 100 Å to about 1,000 Å. In one implementation, polymer material 310 may be deposited in an etch chamber (e.g., a high density plasma reactor) using a known chemistry, such as $CH_2F_2$/HBr, $CH_3F$/HBr, combinations of, for example, $C_4F_6$, $CH_3F$, and $C_4F_8$, and/or any other polymerizing chemistry. For example, when a $CH_2F_2$/HBr chemistry is used, $CH_2F_2$ may be provided at a flow rate ranging from about 20 standard cubic centimeters per minute (sccm) to about 200 sccm and HBr may be provided at a flow rate ranging from about 20 sccm to about 200 sccm. Similar flow rates may be used when other polymerizing chemistries are used.

In one implementation, the temperature in the etch chamber may be maintained below 100° C. (or other acceptable temperature) during the polymer deposition process to keep masks 220 from flowing or otherwise distorting. In one implementation, the temperature in the etch chamber may range from about 20° C. to about 70° C. To optimize polymer coverage over masks 220, the polymer deposition process may include a series of intermittent sputter deposition and etch processes in other implementations consistent with the principles of the invention. The above polymer deposition techniques allow for polymer material 310 to be deposited directly on photoresist masks 220 without the need for an intermediate hard mask etch.

Figure 4:
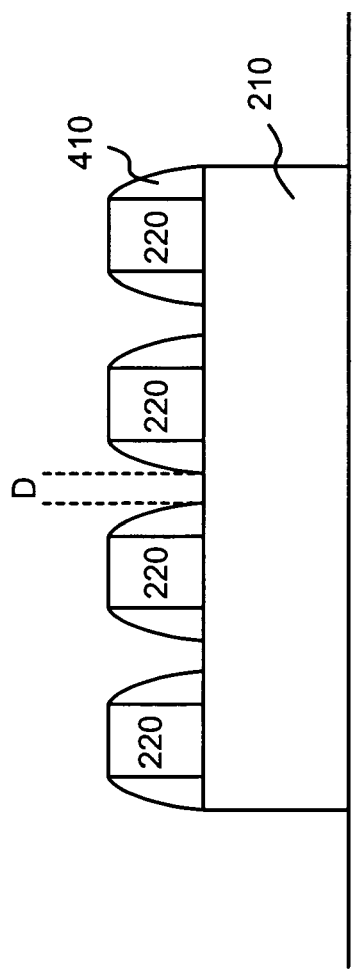

Polymer material 310 may be etched to form polymer spacers 410 adjacent side surfaces of masks 220, as illustrated in FIG. 4 (act 115). In one implementation, polymer spacers 410 may be formed to a height ranging from about 100 Å to about 2,000 Å and a width ranging from about 50 Å to about 1,000 Å. A distance D between a spacer 410 associated with a mask 220 and a spacer associated with an adjacent mask 220 may range from about 300 Å to about 700 Å.

In one implementation consistent with the principles of the invention, the etch of polymer material 310 to form spacers 410 may be performed in the same etch chamber as the polymer deposition process by changing the chemistry that is used. The etch chemistry may include, for example, organic etch chemistries, such as $HBr/O_2$, $CF_4/O_2$, $CO/O_2$, etc. For example, when a $HBr/O_2$ chemistry is used, HBr may be provided at a flow rate ranging from about 20 sccm to about 200 sccm and $O_2$ may be provided at a flow rate ranging from about 20 sccm to about 200 sccm. Similar flow rates may be used when other chemistries are used. During the polymer etch, the etch chamber may be maintained at a temperature ranging from about 20° C. to about 70° C.

Figure 5:
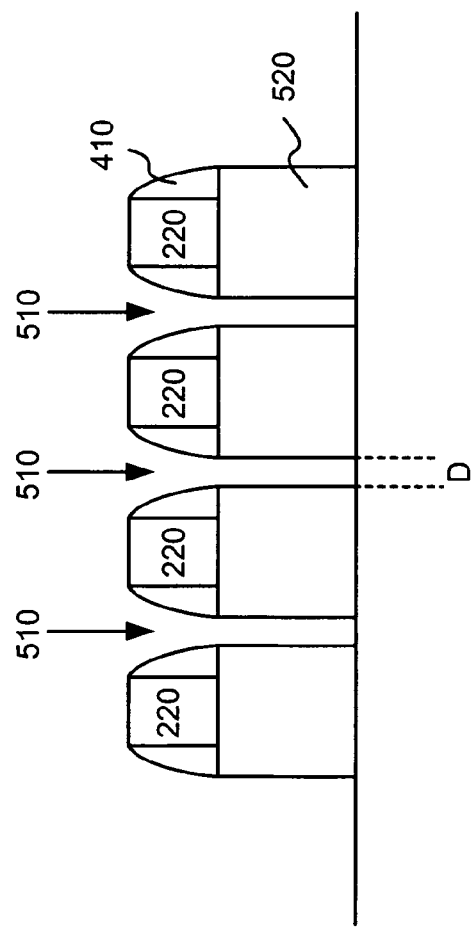

Layer 210 may then be etched to form spaces 510 in layer 210 that are smaller than lithographic limits, as illustrated in FIG. 5 (act 120). Spaces 510 may be formed to a width that may substantially correspond to distance D between adjacent spacers 410 (i.e., a distance ranging from about 300 Å to about 700 Å). The formation of spaces 510 causes structures 520 to be formed. In one implementation, structures 520 may be used as hard mask structures for subsequent etching of one or more layers beneath layer 210. In this way, patterning may be performed with dimensions that are not possible with conventional lithographic techniques.

Figure 6:
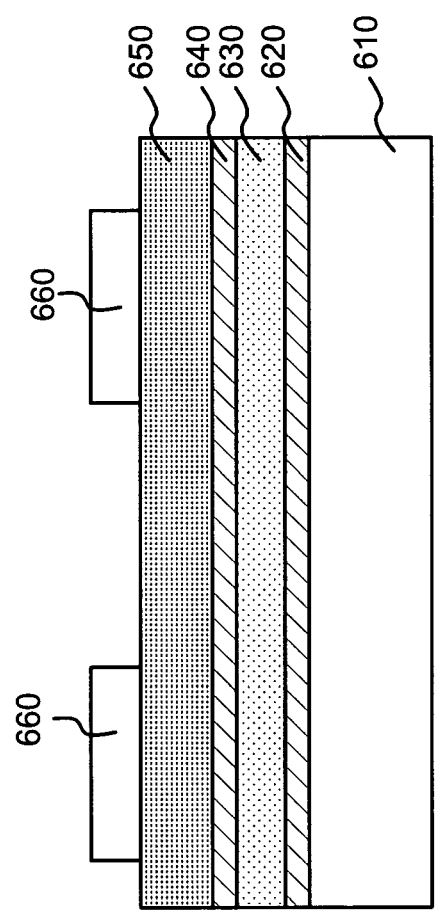
FIGS. 6-17 illustrate exemplary views of a semiconductor memory device fabricated using the processing described in FIG. 1.

The following example illustrates the above processing. FIG. 6 illustrates the cross-section of a semiconductor device 600 formed in accordance with an embodiment of the invention. In one implementation, semiconductor device 600 may include an electrically erasable programmable read only memory (EEPROM), such as a flash memory device. Referring to FIG. 6, semiconductor device 600 may include layers 610, 620, 630, 640 and 650. In an exemplary embodiment, layer 610 may be a substrate of semiconductor device 600 and may include silicon, germanium, silicon-germanium, or other semiconducting materials. In alternative implementations, layer 610 may be a conductive layer or a dielectric layer formed a number of layers above the surface of a substrate in semiconductor device 600.

Layer 620 may be a dielectric layer formed on layer 610 in a conventional manner. In an exemplary implementation, dielectric layer 620 may include an oxide, such as a silicon oxide (e.g., $SiO_2$), and may have a thickness ranging from about 20 Å to about 100 Å. Dielectric layer 620 may function as a tunnel oxide layer for a subsequently formed memory cell of semiconductor device 600.

Layer 630 may be formed on layer 620 in a conventional manner and may include a dielectric material, such as a nitride (e.g., a silicon nitride) or an oxynitride. Layer 630, consistent with the invention, may act as a charge storage layer for semiconductor device 600 and may have a thickness ranging from about 50 Å to about 150 Å. In alternative implementations, layer 630 may include a conductive material, such as polycrystalline silicon, used to form a floating gate electrode.

Layer 640 may be formed on layer 630 in a conventional manner and may include a dielectric material, such as an oxide (e.g., $SiO_2$). Alternatively, layer 640 may include a material having a high dielectric constant (K), such as $Al_2O_3$ or $HfO_2$, that may be deposited or thermally grown on layer 630. In still other alternatives, layer 640 may be a composite that includes a number of dielectric layers or films. Layer 640 may have a thickness ranging from about 50 Å to about 200 Å and may function as an inter-gate dielectric for memory cells in semiconductor device 600.

Layer 650 may include a conductive material, such as polycrystalline silicon, formed on layer 640 in a conventional manner. Alternatively, layer 650 may include other semiconducting materials, such as germanium or silicon-germanium, or various metals, such as titanium or tungsten. Layer 650, consistent with an implementation of the invention, may be used to form one or more control gate electrodes for one or more memory cells in semiconductor device 600. In an exemplary implementation, layer 650 may have a thickness ranging from about 500 Å to about 2,000 Å. An optional silicide layer, such as titanium silicide (not shown) may be formed on layer 650.

A photoresist material may be patterned and etched to form masks 660 on the top surface of layer 650, as illustrated in FIG. 6. Masks 660 may be used to facilitate formation of one or memory cells in semiconductor device 600, as described in more detail below.

Figure 7:
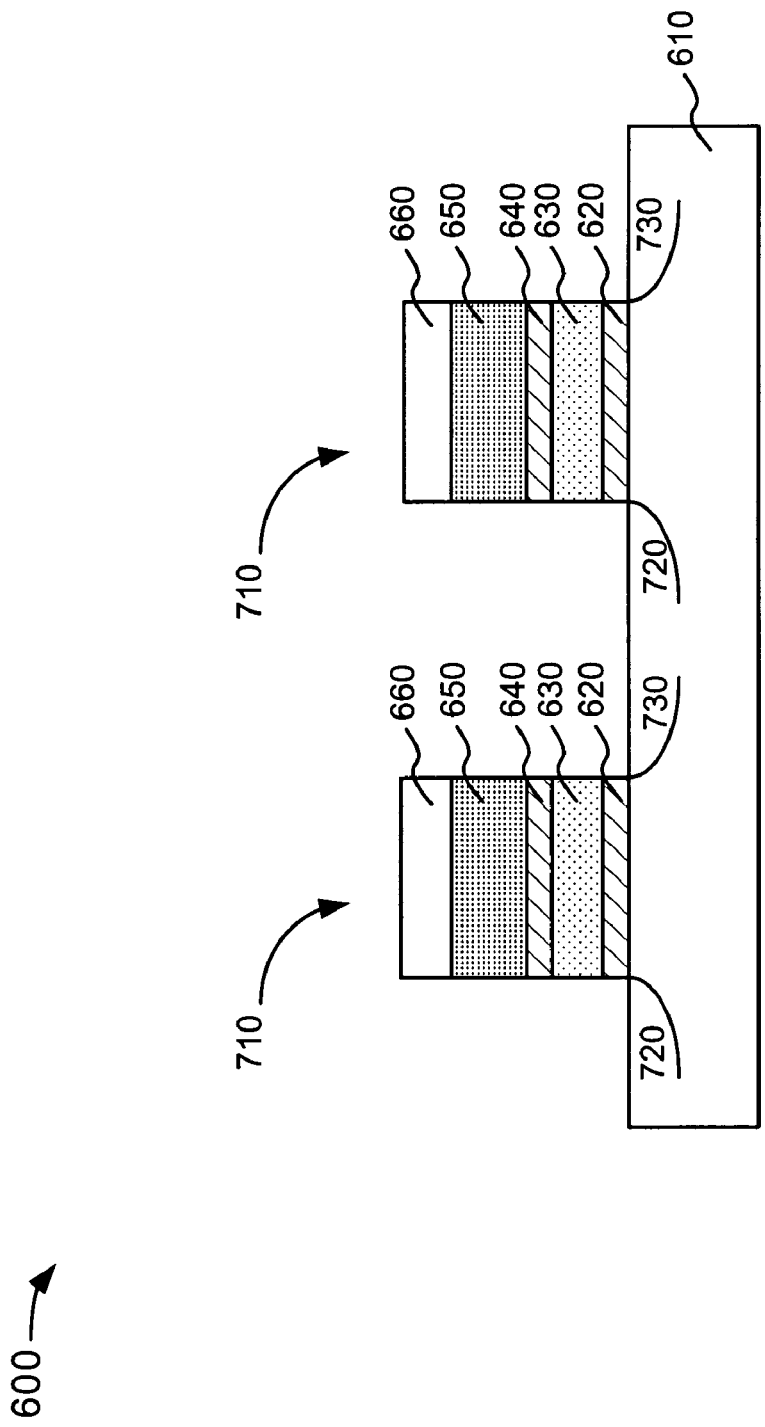

Semiconductor device 600 may then be etched, as illustrated in FIG. 7. Referring to FIG. 7, layers 620-650 may be etched in a conventional manner with the etching terminating at substrate 610, thereby forming structures 710. Alternatively, the etching may terminate at another layer, such as layer 640, followed in some implementations by additional etching, to form structures 710. Each structure 710 (also referred to herein as a memory cell 710) may represent a memory cell of semiconductor device 600, where each memory cell 710 includes a dielectric layer 620, a charge storage layer 630, an inter-gate dielectric layer 640, and a control gate 650. Only two memory cells 710 are illustrated in semiconductor device 600 in FIG. 7 for simplicity. It should be understood that semiconductor device 600 may typically include a memory array including a large number of memory cells 710.

In an exemplary implementation consistent with the invention, each memory cell 710 may be a SONOS-type memory cell, with a silicon control gate electrode 650 formed on an oxide-nitride-oxide (ONO) stack (i.e., layers 640, 630, and 620), with nitride layer 630 acting as a charge storage layer, and the ONO stack being formed on a silicon substrate 610.

Source and drain regions 720 and 730 may then be formed in substrate 610, as illustrated in FIG. 7. For example, n-type or p-type impurities may be implanted in substrate 610 to form source and drain regions 720 and 730, based on the particular end device requirements. The particular implantation dosages and energy used to form source and drain regions 720 and 730 may be selected based on the particular end device requirements. One of ordinary skill in the art would be able to optimize the source/drain implantation process based on the particular circuit requirements. It should also be understood that source region 720 and drain region 730 may alternatively be formed at other points in the fabrication process of semiconductor device 600. For example, sidewall spacers may be formed prior to the source/drain ion implantation to control the location of the source/drain junctions based on the particular circuit requirements.

Figure 8:
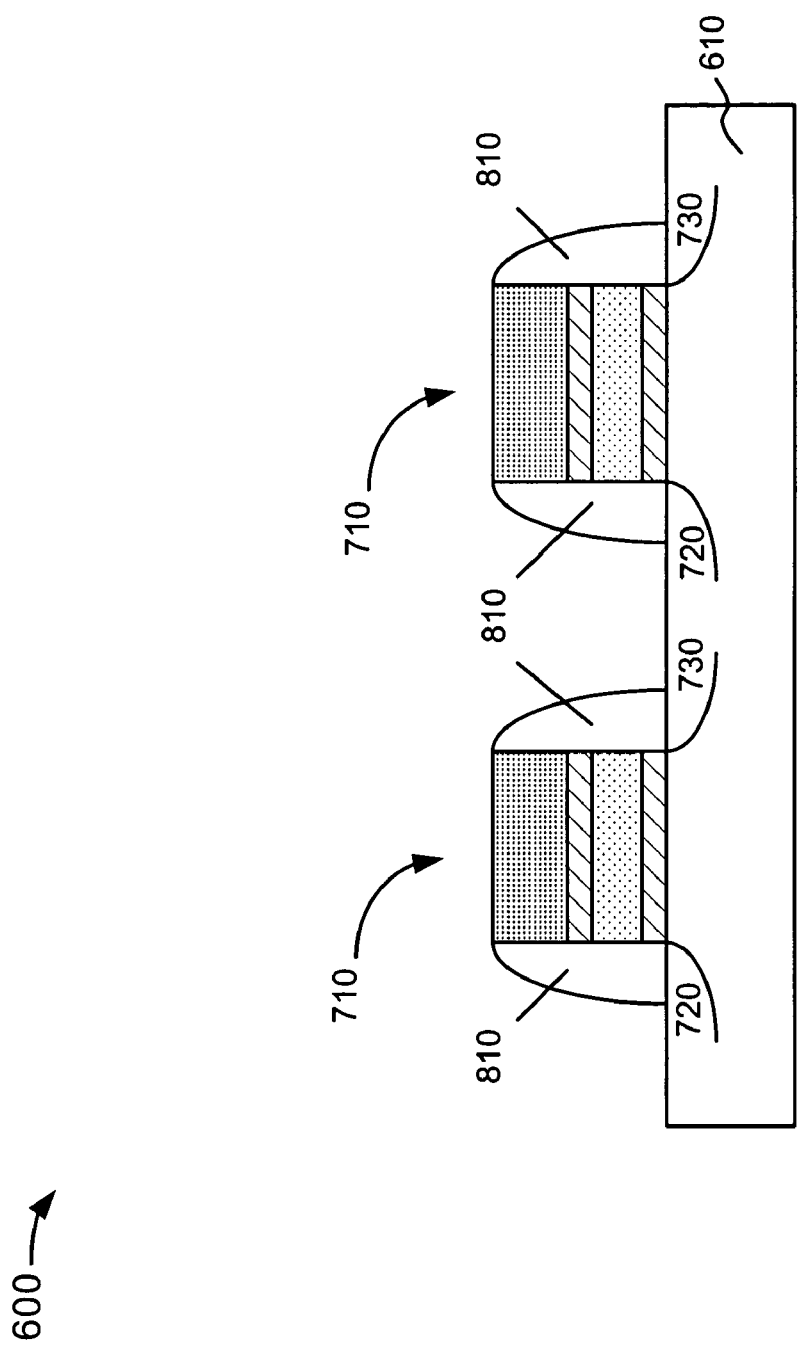

Photoresist masks 660 may be removed using a conventional process. Spacers 810 may be formed adjacent the sidewalls of the memory cells 710, as illustrated in FIG. 8. For example, a dielectric material, such as a silicon oxide, a silicon nitride, a silicon oxynitride or another dielectric material, may be deposited and etched to form spacers 810 on each side of memory cells 710, as illustrated in FIG. 8. Spacers 810 may be used to electrically isolate adjacent memory cells 710 from each other. Spacers 810 may also be used to facilitate the deposition of impurities in semiconductor device 600.

Figure 9:
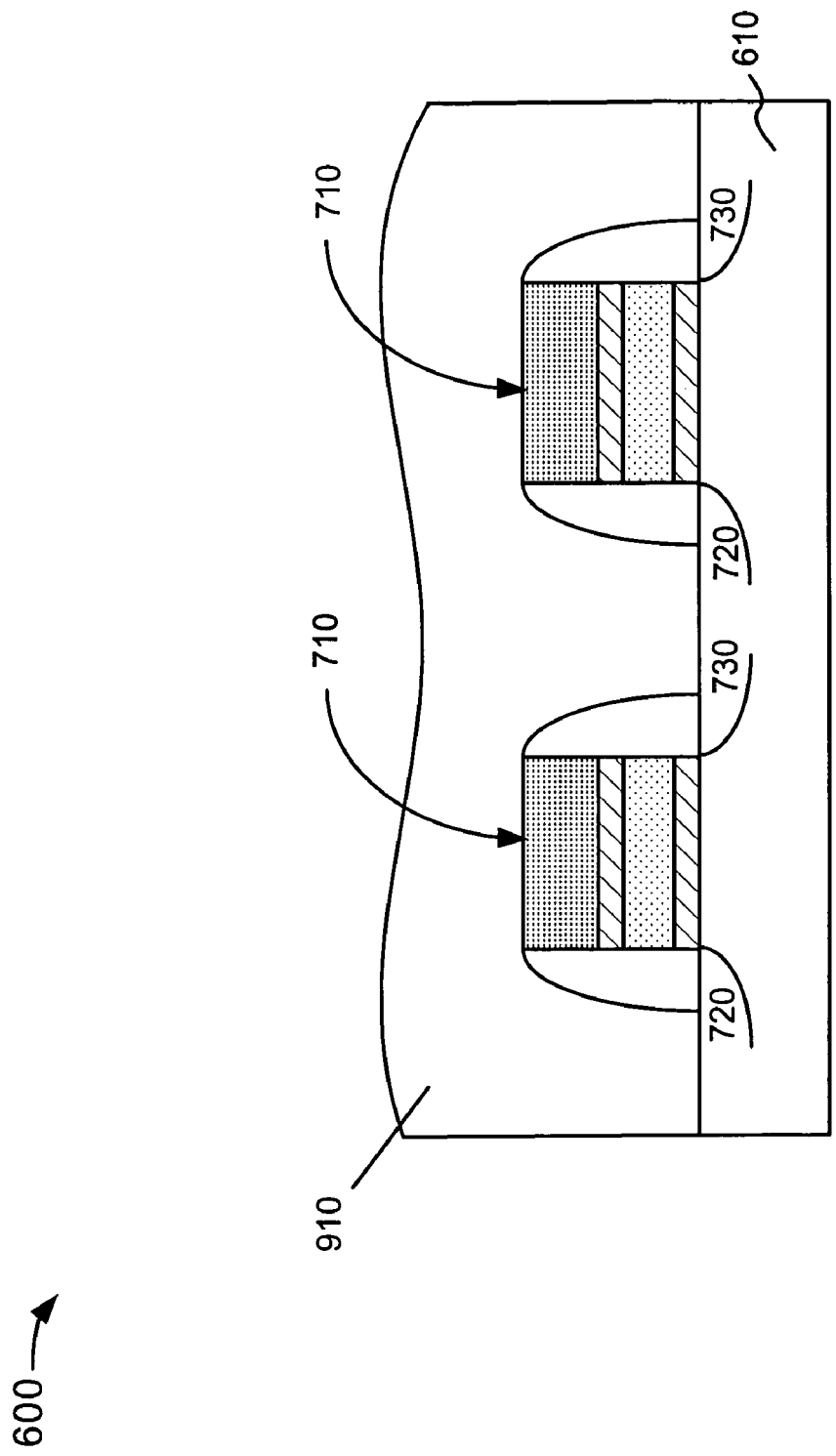

An interlayer dielectric (ILD) layer 910 may be deposited over semiconductor device 600, as illustrated in FIG. 9. In an exemplary implementation, ILD layer 910 may include a phosphosilicate glass (PSG) material, a boro-phosphosilicate glass (BPSG) material, an oxide, or some other dielectric material. The thickness of ILD 910 may range from about 1,000 Å to about 10,000 Å.

Figure 10:
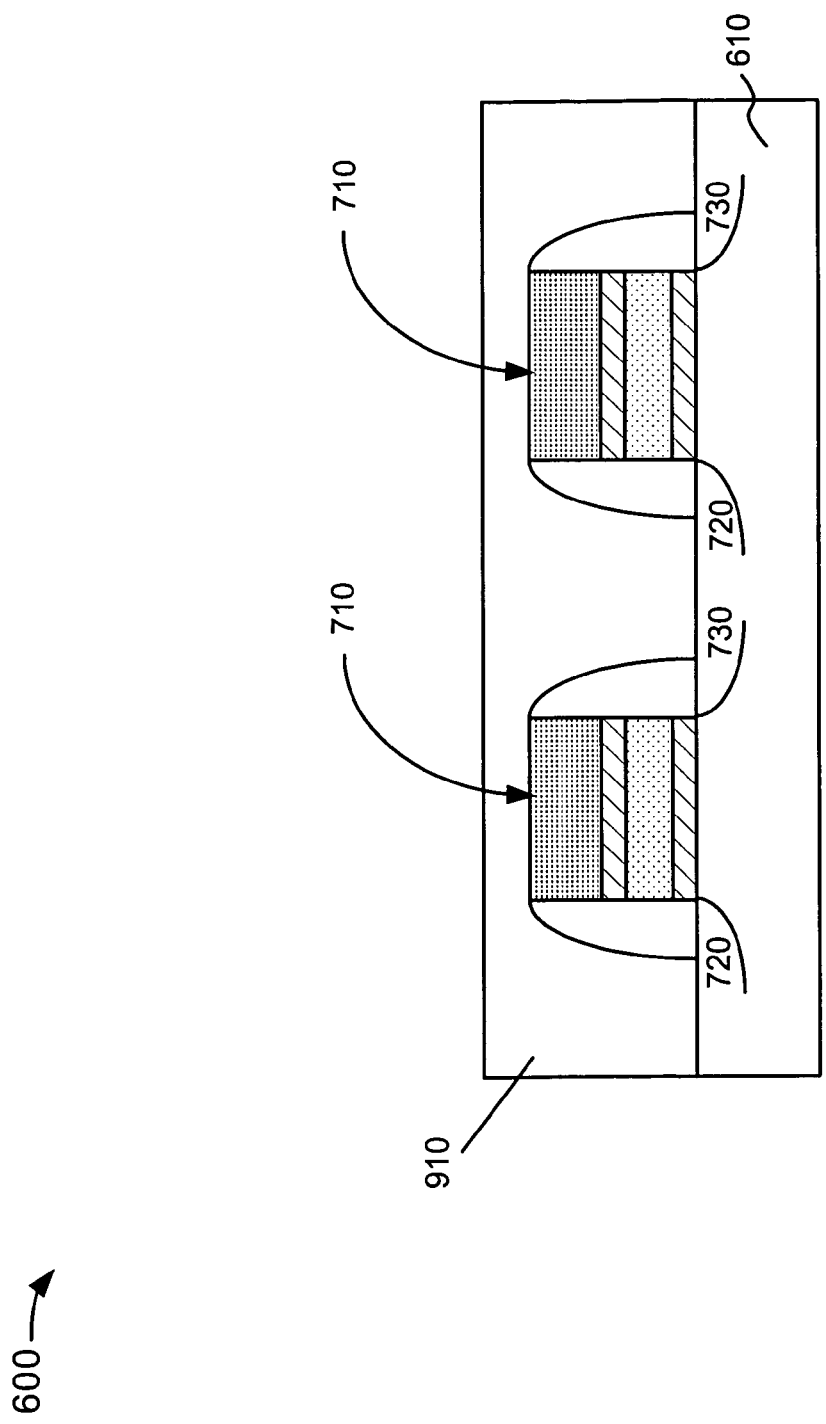

ILD 910 may optionally be planarized using a conventional process, such as a chemical-mechanical polishing (CMP) process, as illustrated in FIG. 10. Referring to FIG. 10, the CMP process may planarize the top surface of ILD 910 to facilitate formation of subsequent structures, such as interconnect lines. ILD 910, consistent with the invention, may represent an ILD located closest to substrate 610. In alternative implementations, ILD 910 may represent an interlayer dielectric formed a number of layers above the surface of substrate 610. In each case, ILD 910 may function to isolate various conductive structures, such as various interconnect lines described below, or to isolate source region 720 or drain region 730 from other conductive structures.

Figure 11:
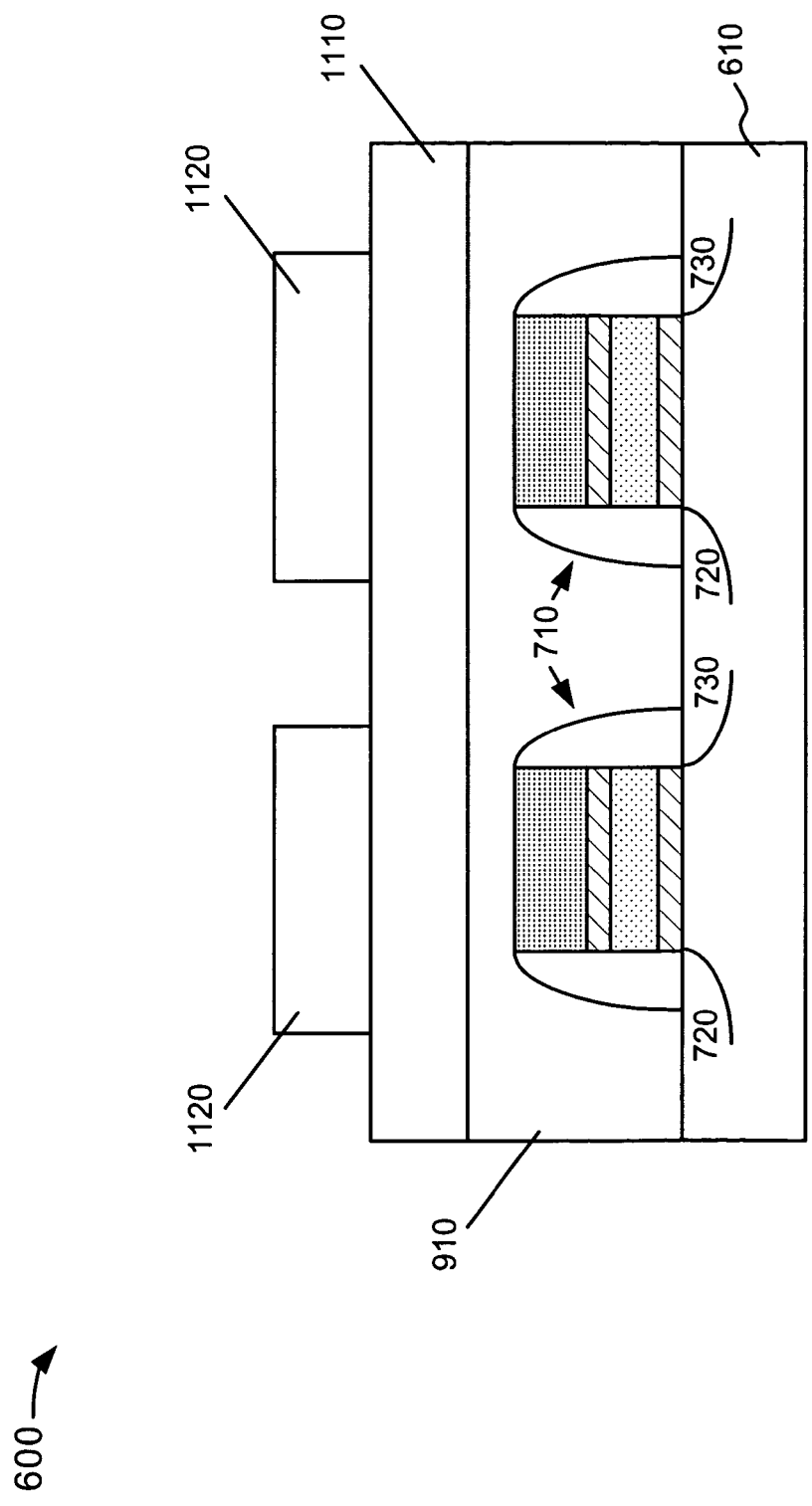

A hard mask layer 1110 may be formed over semiconductor device 600, as illustrated in FIG. 11. In an exemplary implementation, hard mask layer 1110 may comprise amorphous carbon, SiLK, $SiO_2$, SiOC, and/or some other hard mask material. The thickness of hard mask layer 1110 may range from about 100 Å to about 2,000 Å.

A photoresist material may be patterned and etched to form masks 1120 on the top surface of layer 1110. Masks 1120 may be used to facilitate etching layer 1110, as described in more detail below. The width of each mask 1120 may range from about 800 Å to about 2,000 Å. In addition, the pitch (i.e., the center-to-center distance between masks 1120) may range from about 1,200 Å to about 2,000 Å.

Figure 12:
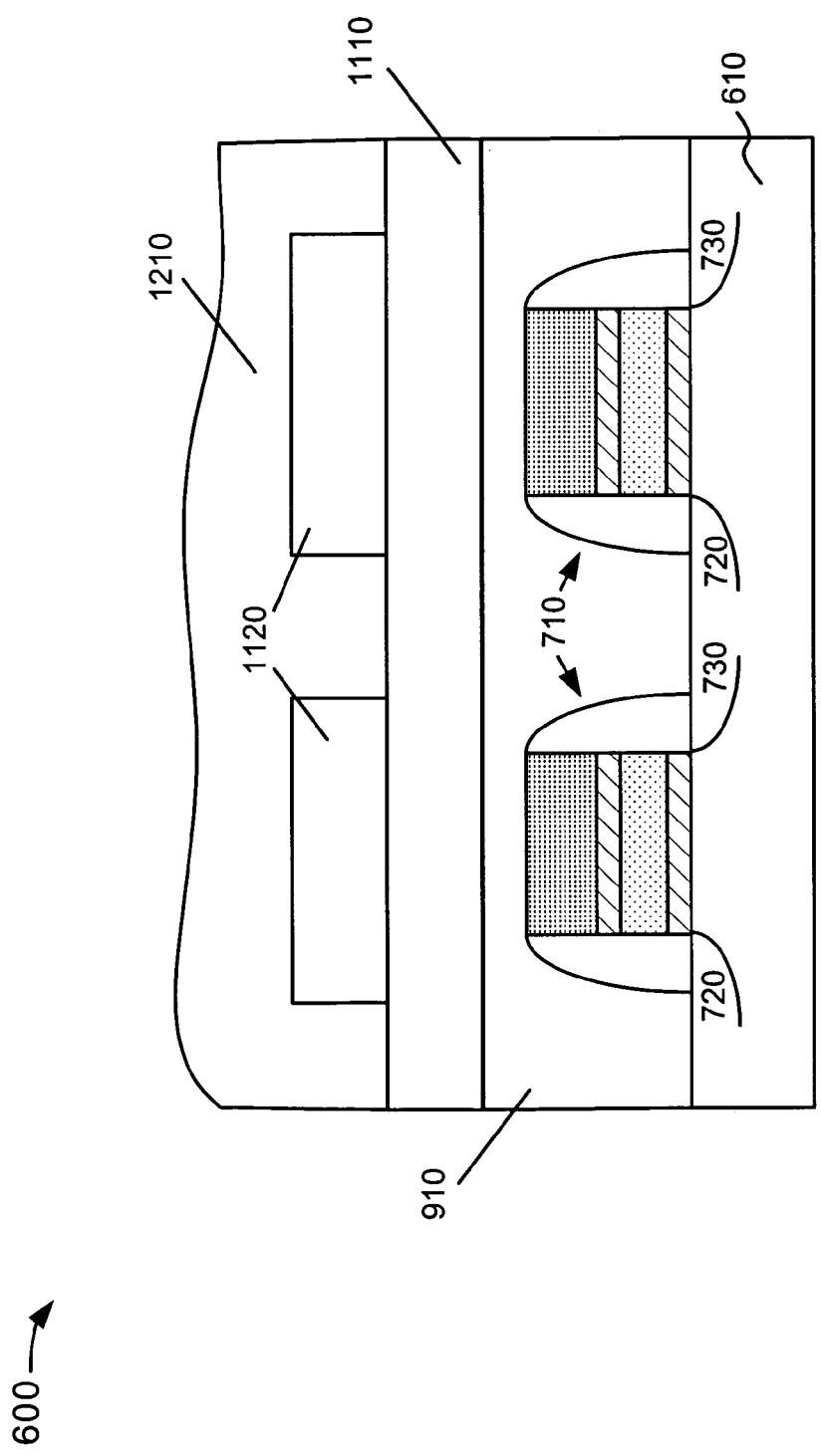

An in-situ polymer spacer deposition and etch may be performed. For example, a polymer material 1210 may be deposited on semiconductor device 600, as illustrated in FIG. 12. Polymer material 1210 may be deposited to a thickness ranging from about 100 Å to about 1,000 Å. As set forth above, polymer material 1210 may be deposited in an etch chamber (e.g., a high density plasma reactor) using a known chemistry, such as $CH_2F_2$/HBr, $CH_3F$/HBr, combinations of, for example, $C_4F_6$, $CH_3F$, and $C_4F_8$, and/or any other polymerizing chemistry at a temperature ranging from about 20° C. to about 70° C. Similar flow rates as that described above with respect to FIG. 3 may also be used.

Figure 13:
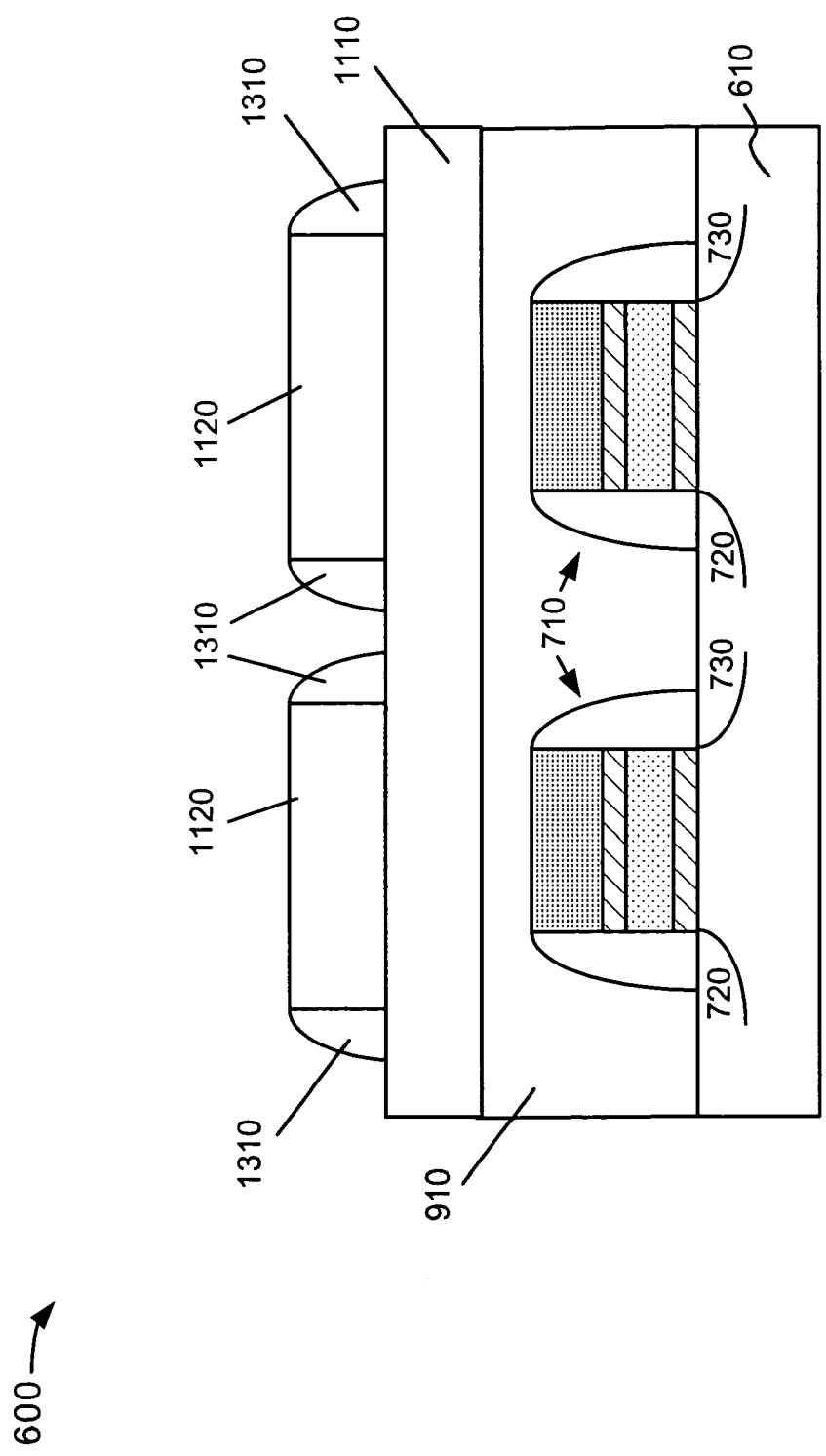

Polymer material 1210 may be etched to form polymer spacers 1310 adjacent side surfaces of masks 1120, as illustrated in FIG. 13. In one implementation, polymer spacers 1310 may be formed to a height ranging from about 100 Å to about 2,000 Å and a width ranging from about 50 Å to about 1,000 Å. A distance between a spacer 1310 associated with a mask 1120 and a spacer associated with an adjacent mask 1120 may range from about 200 Å to about 800 Å.

As set forth above, the etching of polymer material 1210 to form spacers 1310 may be performed in the same etch chamber as the polymer deposition process by changing the chemistry that is used. The etch chemistry may include, for example, organic etch chemistries, such as $HBr/O_2$, $CF_4/O_2$, $CO/O_2$, etc. The etch chamber may be maintained at a temperature ranging from about 20° C. to about 70° C. during the etching of polymer material 1210. In addition, similar flow rates as that described above with respect to FIG. 4 may be used.

Figure 14:
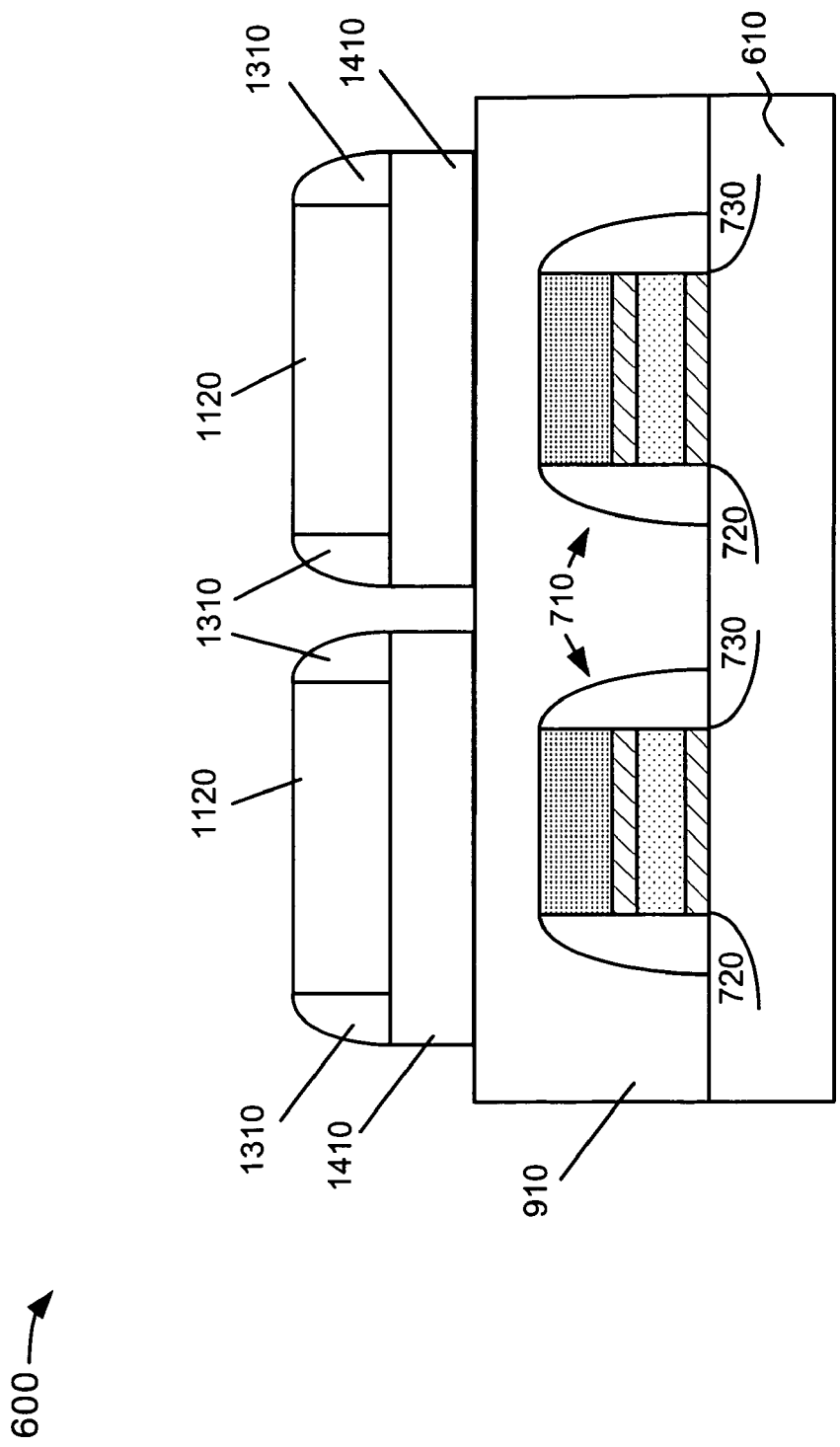

Hard mask layer 1110 may then be etched to form a space in layer 1110 that is smaller than lithographic limits, as illustrated in FIG. 14. The space between structures 1410 may be formed to a width ranging from about 200 Å to about 800 Å. The etching causes structures 1410 to be formed on either side of the space. Structures 1410 may be used as hard mask structures for subsequent etching of semiconductor 600. In this way, patterning may be performed with dimensions that are not possible with conventional lithographic techniques.

Figure 15:
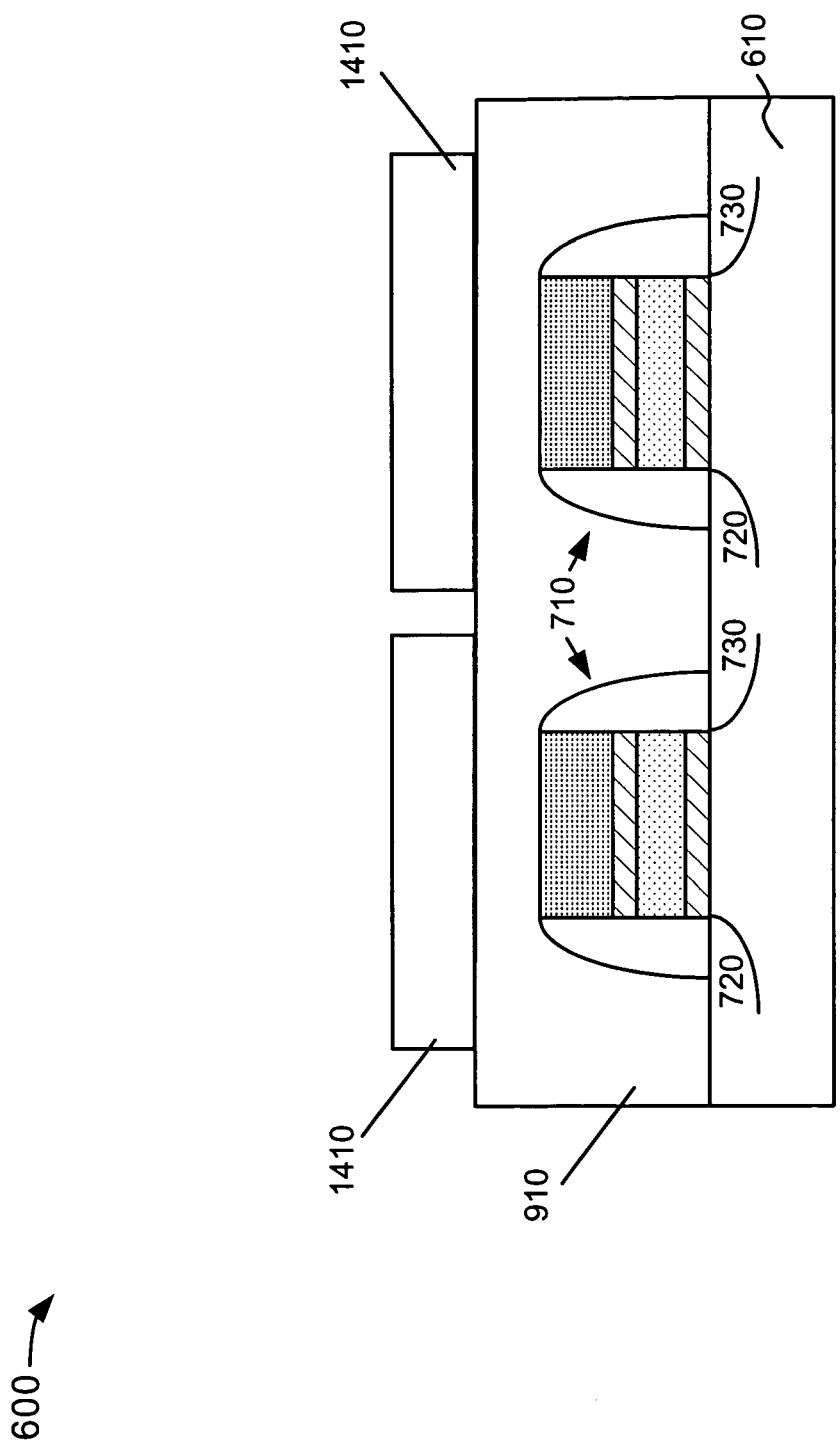
Figure 16:
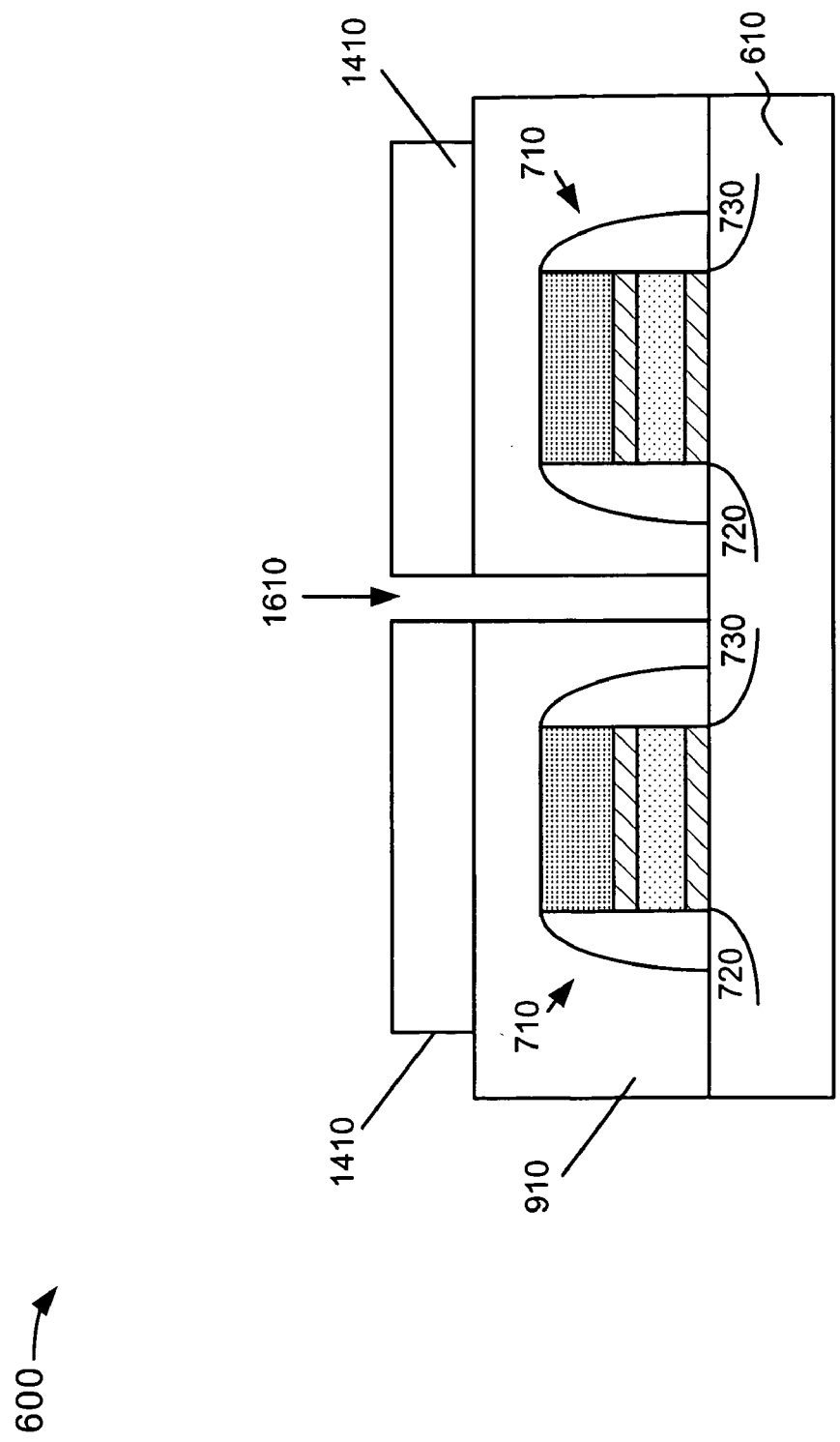
Figure 17:
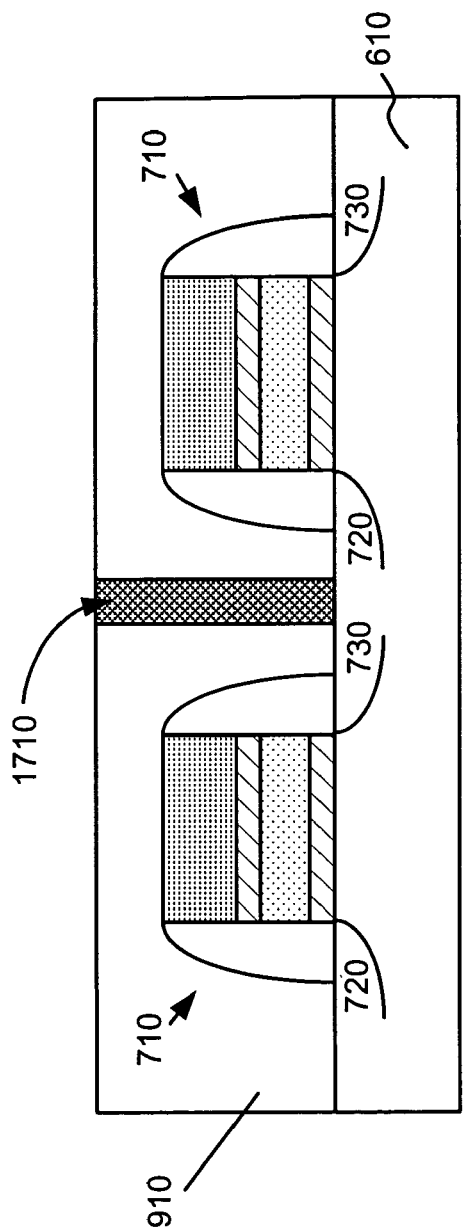

Masks 1120 and spacers 1310 may be removed in a conventional manner, as illustrated in FIG. 15. Hard mask structures 1410 may be used to form a trench 1610 in ILD 910, as illustrated in FIG. 16, using a well-known etching technique, with the etching terminating at substrate 610. The width of trench 1610 may range from about 200 Å to about 800 Å. Trench 1610 may be used to form a contact to source region 720 or drain region 730. Next, hard mask structures 1410 may be removed and a metal layer 1710, such as copper or aluminum, may be deposited to fill trench 1610, as illustrated in FIG. 17. Metal layer 1610 may represent a contact to, for example, source region 720 and/or drain region 730.

While the above example focuses on forming a space for a contact that is below lithographic limits, it will be appreciated that the above techniques can be performed for forming sub-lithographic spaces for other reasons in one or more underlying material layers. For example, the techniques described above can also be used for forming the gate stack.

Thus, in implementations consistent with the principles of the invention, polymer spacers are formed on photoresist masks to form spaces that are smaller than lithographic techniques permit.

CONCLUSION

The foregoing description of exemplary embodiments of the invention provides illustration and description, but is not intended to be exhaustive or to limit the invention to the precise form disclosed. Modifications and variations are possible in light of the above teachings or may be acquired from practice of the invention. For example, in the above descriptions, numerous specific details are set forth, such as specific materials, structures, chemicals, processes, etc., in order to provide a thorough understanding of the present invention. However, implementations consistent with the invention can be practiced without resorting to the details specifically set forth herein. In other instances, well known processing structures have not been described in detail, in order not to unnecessarily obscure the thrust of the present invention. In practicing the present invention, conventional deposition, photolithographic and etching techniques may be employed, and hence, the details of such techniques have not been set forth herein in detail.

While a series of acts has been described with regard to FIG. 1, the order of the acts may be varied in other implementations consistent with the invention. Moreover, non-dependent acts may be implemented in parallel.

No element, act, or instruction used in the description of the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A method comprising:
forming a first material layer on a semiconductor device;
forming a photoresist layer;
patterning the photoresist layer to form at least two masks;
forming polymer spacers on adjacent side surfaces of the at least two masks using a series of intermittent sputter deposition and etch processes; and
etching the first material layer using the at least two masks and the polymer spacers to create at least one sub-lithographic space in the first material layer.

2. The method of claim 1 wherein the first material layer includes a hard mask layer.

3. The method of claim 2 further comprising:
using the etched hard mask layer to etch a second material layer beneath the hard mask layer.

4. The method of claim 2 wherein the hard mask layer comprises at least one of amorphous carbon or a low-k dielectric material, and
wherein the forming the hard mask layer includes:
forming the hard mask layer to a thickness ranging from about 100 Å to about 2,000 Å.

5. The method of claim 1 wherein the first material layer includes an antireflective coating, a polycrystalline silicon material, or a dielectric material.

6. The method of claim 1 wherein forming polymer spacers includes:
forming the polymer spacers to a height ranging from about 100 Å to about 1,000 Å and a width ranging from about 50 Å to about 1,000 Å.

7. The method of claim 1 wherein forming polymer spacers includes:
performing the series of intermittent sputter deposition and etch processes in a same etch chamber.

8. The method of claim 1 wherein the series of intermittent sputter deposition and etch processes is performed at a temperature below 100° C.

9. The method of claim 1 wherein forming polymer spacers includes:
using a first chemistry for depositing the polymer material, the first chemistry including at least one of $CH_2F_2$, $CH_3F$, $C_4F_6$, or $C_4F_8$.

10. The method of claim 1 wherein a width of the sub-lithographic space ranges from about 50 Å to about 1,000 Å.

11. A method comprising:
forming a plurality of first structures on a semiconductor device;
forming spacers adjacent side surfaces of each of the plurality of first structures using a series of intermittent sputter deposition and etch processes to form a plurality of second structures; and
using the plurality of second structures to form at least one sub-lithographic opening in a material layer located below the plurality of second structures.

12. The method of claim 11 wherein the plurality of first structures comprises photoresist masks.

13. The method of claim 11 wherein the series of intermittent sputter deposition and etch processes is performed at a temperature below 100° C.

14. The method of claim 11 wherein forming spacers includes:
depositing a spacer material on the semiconductor device in an etch chamber using a first chemistry, and
etching the spacer material in the etch chamber to form the spacers using a second chemistry.

15. The method of claim 11 wherein the using includes:
using the plurality of second structures as a mask, and
etching the material layer located below the plurality of second structures to form the at least one sub-lithographic opening to a width ranging from about 50 Å to about 1,000 Å.

16. A method for forming an opening in a semiconductor device, the method comprising:
forming a plurality of first structures on a semiconductor device;
forming spacers adjacent side surfaces of each of the plurality of first structures using a series of intermittent sputter deposition and etch processes to form a plurality of second structures; and
using the plurality of second structures as a mask to form the opening in a material layer located below the plurality of second structures, the opening being formed to a width less than approximately 100 nm.

17. The method of claim 16 wherein the
series of intermittent sputter deposition and etch processes is performed in a same etch chamber.

* * * * *